United States Patent
Tani et al.

(10) Patent No.: US 7,646,611 B2
(45) Date of Patent: Jan. 12, 2010

(54) PRINTED CIRCUIT BOARD AND MANUFACTURING METHOD THEREOF

(75) Inventors: Emiko Tani, Ibaraki (JP); Yasuto Ishimaru, Ibaraki (JP); Toru Mizutani, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 163 days.

(21) Appl. No.: 12/021,419

(22) Filed: Jan. 29, 2008

(65) Prior Publication Data

US 2008/0180928 A1 Jul. 31, 2008

(30) Foreign Application Priority Data

Jan. 31, 2007 (JP) .............................. 2007-020591

(51) Int. Cl.
*H01R 9/00* (2006.01)
(52) U.S. Cl. ...................... 361/772; 361/749; 361/774; 174/254
(58) Field of Classification Search ......... 361/749–750, 361/770–774, 782–784; 174/254–258; 257/680–730
See application file for complete search history.

(56) References Cited

U.S. PATENT DOCUMENTS

| | | | |
|---|---|---|---|
| 5,704,593 A * | 1/1998 | Honda | 257/668 |
| 6,081,024 A * | 6/2000 | Nakamoto | 257/668 |
| 6,853,090 B2 * | 2/2005 | Kim et al. | 257/784 |
| 6,930,380 B2 * | 8/2005 | Shimanuki et al. | 257/691 |
| 2003/0197200 A1 | 10/2003 | Kim et al. | |
| 2004/0159930 A1 | 8/2004 | Makita et al. | |
| 2004/0242027 A1 | 12/2004 | Tanokura et al. | |
| 2005/0260391 A1 | 11/2005 | Nakamura et al. | |
| 2006/0181299 A1 | 8/2006 | Hirae | |

FOREIGN PATENT DOCUMENTS

| | | |
|---|---|---|
| EP | 1599076 A1 | 11/2005 |
| JP | 2001-358417 A | 12/2001 |

* cited by examiner

*Primary Examiner*—Tuan T Dinh
(74) *Attorney, Agent, or Firm*—Panitch Schwarze Belisario & Nadel LLP

(57) ABSTRACT

A plurality of wiring patterns are formed so as to extend in parallel with each other. A plurality of test terminals are formed in a substantially rectangular shape such that respective widths thereof increase toward respective one sides from respective ends of the plurality of wiring patterns. The plurality of test terminals in each group are arranged so as to be aligned along a length direction of the wiring patterns. The wiring patterns are formed so as to be longer in the order, and the test terminals are further away from a mounting region in the order. An interval (width of a plating resist) between the test terminals in each group and the wiring patterns in the other group adjacent thereto is set to decrease in the order.

4 Claims, 7 Drawing Sheets

F I G. 2
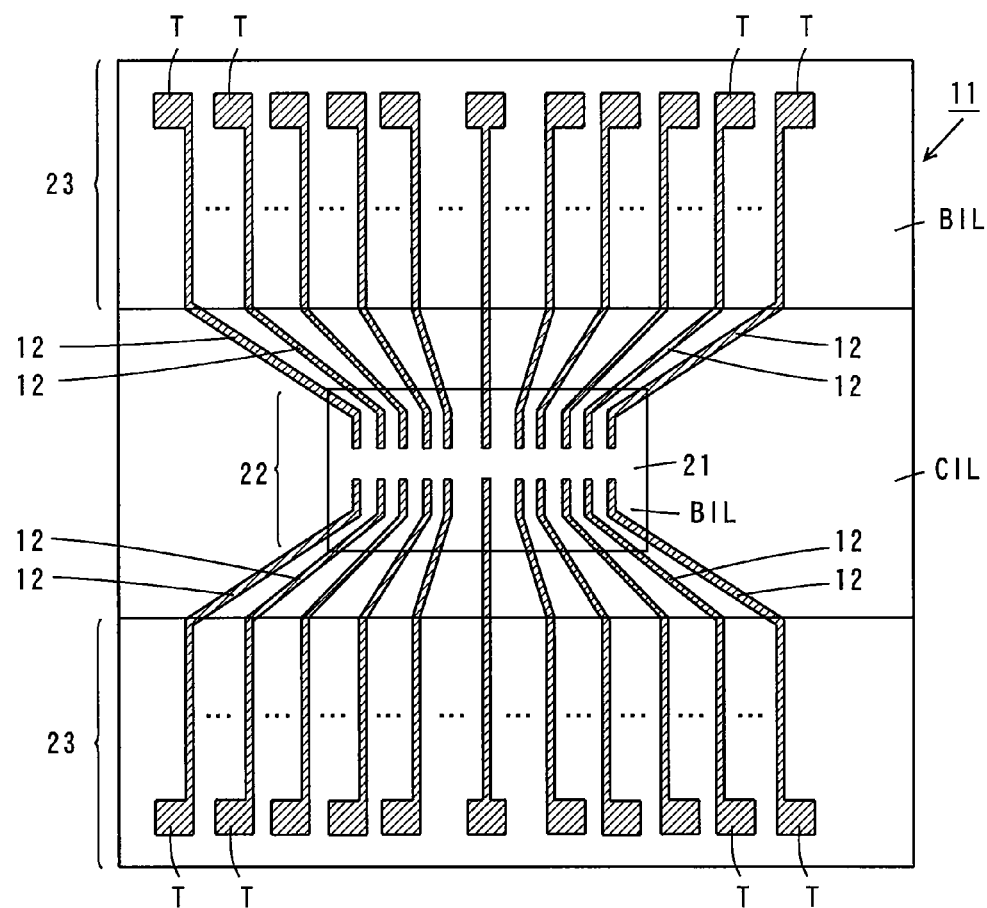

PRINTED CIRCUIT BOARD AND MANUFACTURING METHOD THEREOF

BACKGROUND OF THE INVENTION

1. Field of the Invention

The present invention relates to a printed circuit board and a manufacturing method thereof.

2. Description of the Background Art

As a manufacturing method of a printed circuit board, a TAB (Tape Automated Bonding) technique is generally known.

In this TAB technique, predetermined conductive wiring patterns are formed on a tape carrier (a long-sized tape board). Then, electrodes of electronic components such as semiconductor chips are bonded to the wiring patterns formed on the tape carrier. Thus, the electronic components are mounted on the tape carrier.

In such a printed circuit board, test terminals for checking reliability of connection of the wiring patterns after the mounting of the electronic components are formed (see JP 2001-358417 A, for example).

In recent years, with an increase in density of the wiring, the numbers of the wiring patterns and the test terminals have increased, and intervals between the wiring patterns have become smaller.

Here, a semi-additive method is generally used for manufacturing fine pitch wiring patterns. In this semi-additive method, a plating resist pattern (resist pattern) is formed on a base insulating layer, and the wiring patterns are formed by electrolytic plating in a region where the resist pattern is not formed.

In order to make the intervals between the wiring patterns that are connected to the test terminals small as described in the foregoing, however, the widths of the resist patterns need to be reduced. This, in some cases, causes defects such as lateral inclination of the long and thin resist patterns that are generally formed in a line shape. In such a case, defects of the wiring patterns such as a short circuit between the wiring patterns are generated.

SUMMARY OF THE INVENTION

It is an object of the present invention to provide a printed circuit board and a manufacturing method thereof capable of forming fine pitch wiring patterns without generating defects of the wiring patterns.

(1) According to an aspect of the present invention, a printed circuit board including a mounting region where an electronic component is to be mounted and a non-mounting region where an electronic component is not mounted includes an insulating layer including the mounting region and the non-mounting region and a plurality of wiring patterns that are formed from an inside of the mounting region on the insulating layer to an inside of the non-mounting region on the insulating layer, wherein respective ends of the plurality of wiring patterns in the non-mounting region increase widths thereof toward respective one sides to form a plurality of test terminal portions, respectively, respective portions of the plurality of wiring patterns on the plurality of test terminal portions side are arranged in parallel with each other, the plurality of wiring patterns are divided into a plurality of groups each including a predetermined number of, at least two, wiring patterns, the predetermined number of test terminal portions in each group are arranged along a length direction of the wiring patterns, and an interval between the test terminal portion that is farthest away in each group from the mounting region and the wiring pattern, being the closest to the group, in the other group adjacent thereto is larger than an interval between the test terminal portion that is the closest in each group to the mounting region and the wiring pattern, being the closest to the group, in the other group adjacent thereto.

In the printed circuit board, the interval between the test terminal portion that is farthest away in each group from the mounting region and the wiring pattern, being the closest to the group, in the other group adjacent thereto is larger than the interval between the test terminal portion that is the closest in each group to the mounting region and the wiring pattern, being the closest to the group, in the other group adjacent thereto. This can sufficiently increase, in the manufacture, a width of the resist pattern formed between a region where the test terminal portion at the end of the longest wiring pattern is formed and a region where the wiring pattern adjacent thereto is formed while maintaining small intervals between the plurality of wiring patterns arranged in parallel with each other. Thus, defects of the wiring patterns due to collapse of the resist pattern can be prevented. As a result, the fine pitch wiring patterns can be formed without generating the defects in the wiring patterns.

(2) An interval between the predetermined number of test terminal portions in each group and the wiring pattern, being the closest to the group, in the other group adjacent thereto may become larger with increasing distance from the mounting region.

In this case, the width of the resist pattern formed between a region where the test terminal portions are formed and a region where the wiring pattern adjacent thereto is formed can be increased as the wiring patterns where the test terminal portions are formed become longer. That is, the width of a portion, being likely to collapse, of the resist pattern can be increased. Accordingly, the defects in the wiring patterns due to the collapse of the resist pattern can be sufficiently prevented.

(3) According to another aspect of the present invention, a manufacturing method of a printed circuit board including a mounting region where an electronic component is to be mounted and a non-mounting region where the electronic component is not mounted includes the steps of forming a resist pattern on an insulating layer including the mounting region and the non-mounting region excluding a region where a plurality of wiring patterns extending from an inside of the mounting region to an inside of the non-mounting region are to be formed, forming a conductive layer on the insulating layer excluding a region where the resist pattern is formed, and forming the plurality of wiring patterns on the insulating layer by removing the resist pattern, wherein respective ends of the plurality of wiring patterns in the non-mounting region increase widths thereof toward respective one sides to form a plurality of test terminal portions, respectively, respective portions of the plurality of wiring patterns on the plurality of test terminal portions side are arranged in parallel with each other, the plurality of wiring patterns are divided into a plurality of groups each including a predetermined number of, at least two, wiring patterns, the predetermined number of test terminal portions in each group are arranged along a length direction of the wiring patterns, and the resist pattern is formed, in the process of forming the resist pattern, such that an interval between the test terminal portion that is farthest away in each group from the mounting region and the wiring pattern, being the closest to the group, in the other group adjacent thereto is larger than an interval between the test terminal portion that is the closest in each group to the mounting region and the wiring pattern, being the closest to the group, in the other group adjacent thereto.

In the manufacturing method of the printed circuit board, the resist pattern is formed such that the interval between the test terminal portion that is farthest away in each group from the mounting region and the wiring pattern, being the closest to the group, in the other group adjacent thereto is larger than the interval between the test terminal portion that is the closest in each group to the mounting region and the wiring pattern, being the closest to the group, in the other group adjacent thereto. This can sufficiently increase a width of the resist pattern formed between a region where the test terminal portion at the end of the longest wiring pattern is formed and a region where the wiring pattern adjacent thereto is formed while maintaining small intervals between the plurality of wiring patterns arranged in parallel with each other. Thus, the defects of the wiring patterns due to the collapse of the resist pattern can be prevented. As a result, the fine pitch wiring patterns can be formed without generating the defects in the wiring patterns.

(4) The resist pattern may be formed, in the process of forming the resist pattern, such that an interval between the predetermined number of test terminal portions in each group and the wiring pattern, being the closest to the group, in the other group adjacent thereto becomes larger with increasing distance from the mounting region.

In this case, the width of the resist pattern formed between a region where the test terminal portions are formed and a region where the wiring pattern adjacent thereto is formed can be increased as the wiring patterns where the test terminal portions are formed become longer. That is, the width of a portion, being likely to collapse, of the resist pattern can be increased. Accordingly, the defects in the wiring patterns due to the collapse of the resist pattern can be sufficiently prevented.

According to the present invention, the fine pitch wiring patterns can be formed without generating the defects in the wiring patterns.

Other features, elements, characteristics, and advantages of the present invention will become more apparent from the following description of preferred embodiments of the present invention with reference to the attached drawings.

BRIEF DESCRIPTION OF THE DRAWINGS

FIG. 2 is an enlarged plan view of a mounting part of the printed circuit board of FIG. 1;

DESCRIPTION OF THE PREFERRED EMBODIMENTS

A printed circuit board and a manufacturing method thereof according to an embodiment of the present invention will now be described with reference to drawings. The printed circuit board according to the present embodiment is used as a tape carrier for TAB (Tape Automated Bonding).

(1) Basic Configuration of Printed Circuit Board

Figure 1:
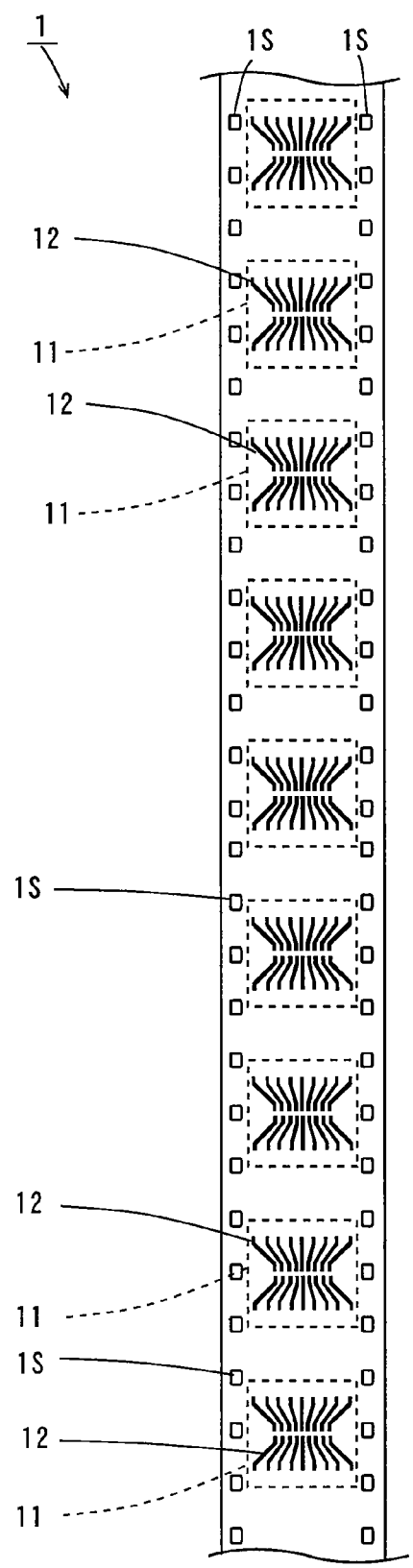
FIG. 1 is a plan view of a printed circuit board according to an embodiment of the present invention.

FIG. 1 is a plan view of a printed circuit board according to an embodiment of the present invention.

As shown in FIG. 1, the long-sized printed circuit board 1 includes a plurality of mounting parts 11 where electronic components such as semiconductor chips are to be mounted. The plurality of mounting parts 11 are provided with predetermined intervals interposed therebetween in a length direction of the printed circuit board 1.

A plurality of square-shaped sprocket holes is are formed at predetermined intervals so as to be aligned in the length direction of the printed circuit board 1 on both sides of the printed circuit board 1.

In addition, wiring patterns 12 composed of, for example, copper for bonding electrodes of the electronic components are formed in each of the mounting parts 11.

(2) Configuration of the Mounting Part

The mounting part 11 of FIG. 1 will now be described more in detail. FIG. 2 is an enlarged plan view of the mounting part 11 of the printed circuit board 1 of FIG. 1.

As shown in FIG. 2, a rectangular mounting region 21 is provided at the center of a base insulating layer BIL. The electronic component such as the semiconductor chip (not shown) is mounted on this mounting region 21. A region excluding the mounting region 21 is referred to as a non-mounting region.

The plurality of wiring patterns 12 are formed so as to extend from the inside of the mounting region 21 of the base insulating layer BIL to one side of the non-mounting region. In addition, the plurality of wiring patterns 12 are formed so as to extend from the inside of the mounting region 21 of the base insulating layer BIL to the other side of the non-mounting region. A test terminal T is provided at each end of the plurality of wiring patterns 12 in the non-mounting region. The test terminals T are used for checking reliability of connection, after the mounting of the electronic component on the mounting region 21, between the electronic component and the wiring patterns 12.

Note that only respective parts of the wiring patterns 12 and the test terminals T are shown, and the respective rest of the wiring patterns 12 and test terminals T is omitted in FIG. 2. In practice, a plurality of wiring patterns 12 are additionally formed between the plurality of wiring patterns 12 shown in FIG. 2.

As described later, the plurality of wiring patterns 12 and the plurality of test terminals T are divided into a plurality of groups each including a predetermined number of wiring patterns 12 and a predetermined number of test terminals T.

A portion of the wiring patterns 12 in the mounting region 21 is referred to as an inner lead portion 22. Moreover, a portion in the vicinity of the ends of the wiring patterns 12 and the test terminals T in the non-mounting region are referred to as an outer lead portions 23.

A cover insulating layer CIL is formed on the base insulating layer BIL excluding a region that includes the outer lead portions 23 on the both sides and the mounting region 21 so as to cover the wiring patterns 12. Accordingly, the inner lead portion 22 and the outer lead portions 23 of the wiring patterns 12 are exposed.

(3) Manufacturing Method of the Printed Circuit Board

Figure 3:
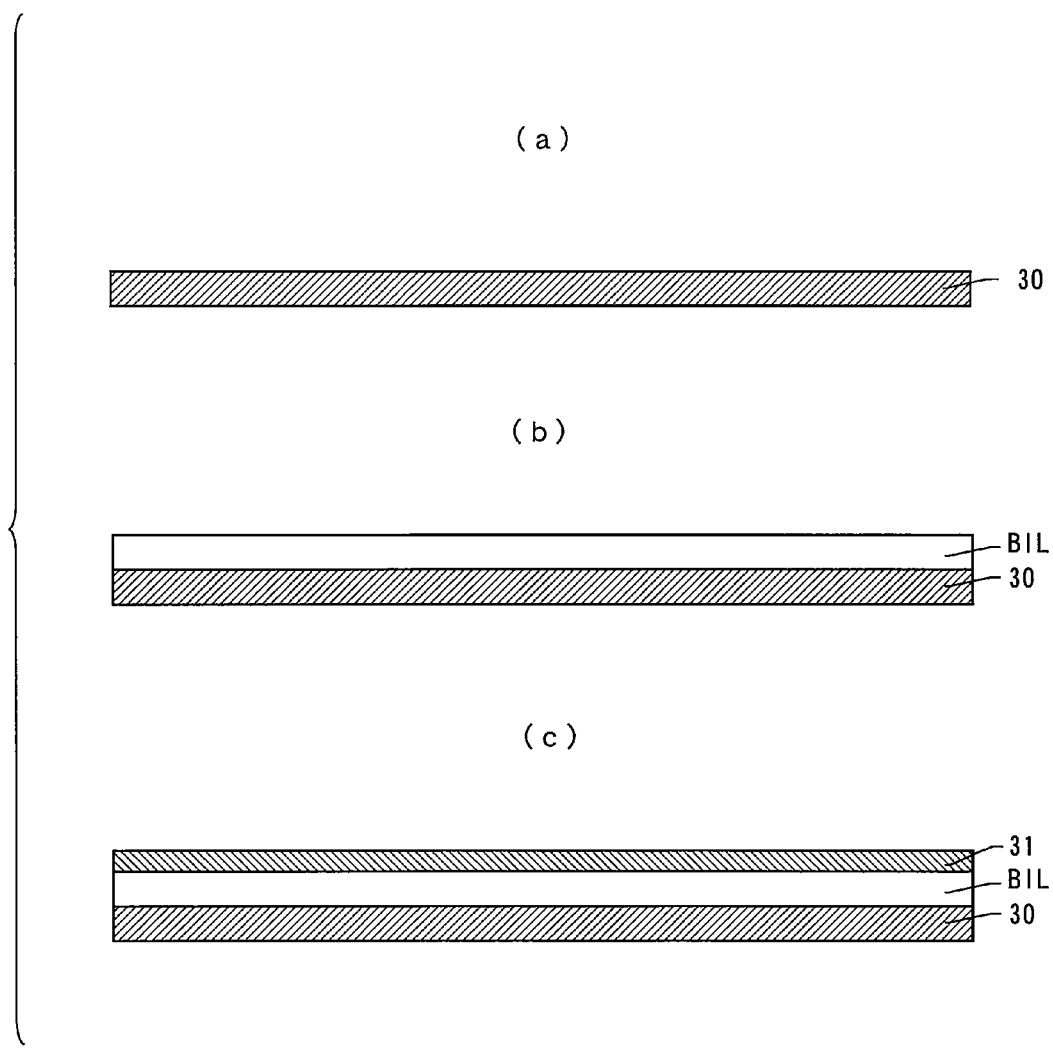
FIG. 3 is a sectional view for explaining steps in a manufacturing method of the printed circuit board.
Figure 4:
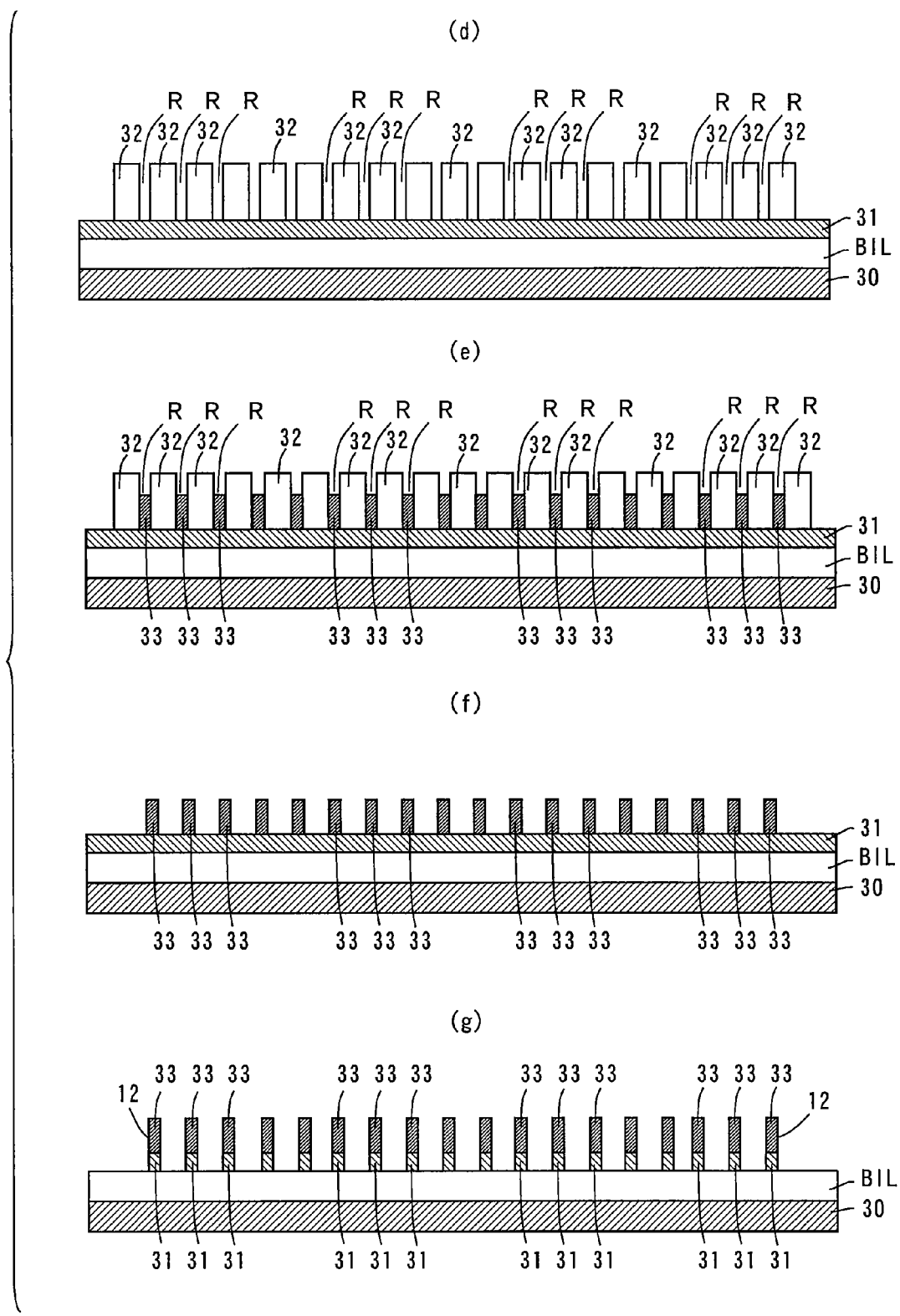
FIG. 4 is a sectional view for explaining steps in the manufacturing method of the printed circuit board.
Figure 5:
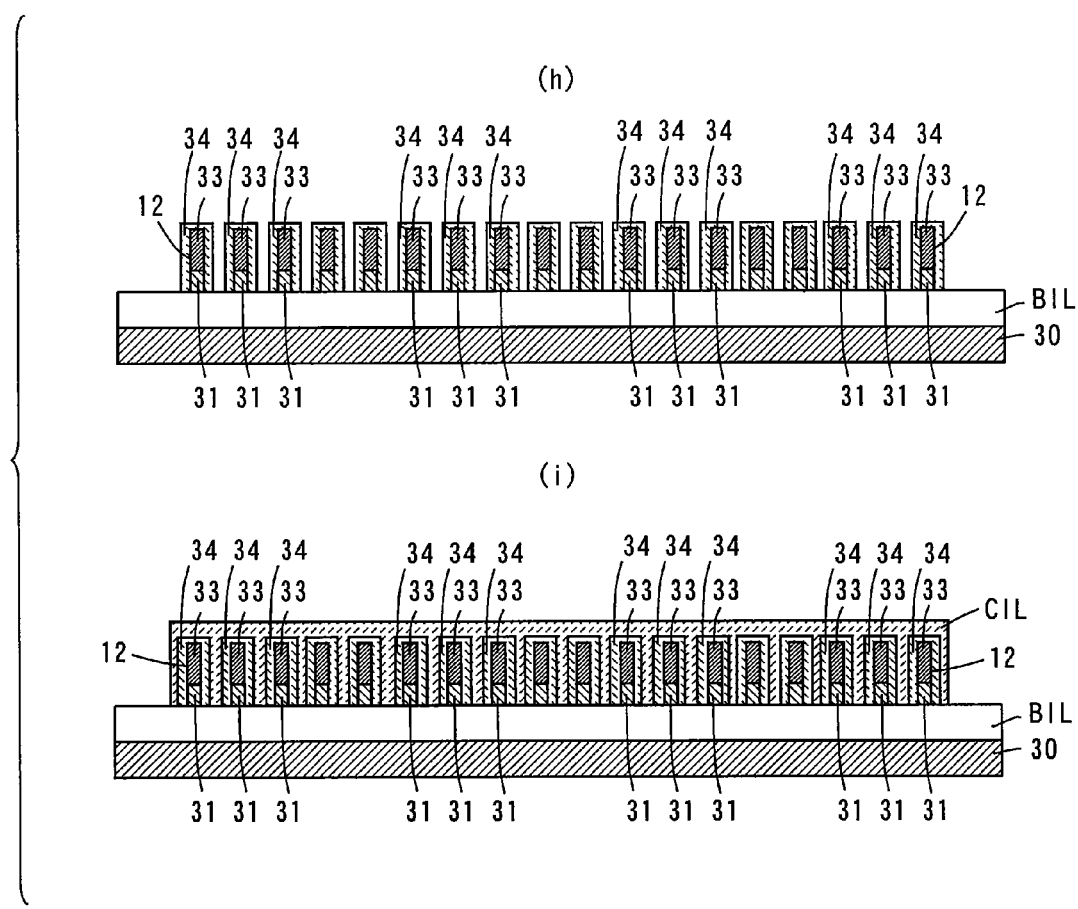
FIG. 5 is a sectional view for explaining steps in the manufacturing method of the printed circuit board.

FIGS. 3 to 5 are sectional views for explaining steps in a manufacturing method, using a semi-additive method, of the printed circuit board 1.

First, a long-sized substrate 30 is prepared as shown in FIG. 3(a). A metal such as a stainless steel plate, a copper plate, a nickel plate, for example, can be used as the long-sized substrate 30.

Next, the base insulating layer BIL is formed on the long-sized substrate 30 as shown in FIG. 3(b). The base insulating layer BIL is made of, for example, polyimide. The thickness of the base insulating layer BIL is preferably not less than 10 μm and not more than 100 μm, and is 25 μm in the present embodiment.

Then, a thin metal film 31 is formed on the base insulating layer BIL by sputtering as shown in FIG. 3(c). Copper is preferably used as the thin metal film 31, although any other material having conductivity may be used.

The thickness of the thin metal film 31 is preferably not less than 0.05 μm and not more than 1 μm, and is 0.1 μm in the present embodiment.

A plating resist 32 having grooves R in a predetermined pattern is subsequently formed on the thin metal film 31 as shown in FIG. 4(d). The plating resist 32 is formed, for example, by forming a resist film on the thin metal film 31 with a dry film resist or the like, exposing the resist film in a predetermined pattern and then developing the resist film. The plating resist 32 is formed in a region excluding a region where the above-described wiring patterns 12 and test terminals T are formed.

Next, a conductive layer 33 is formed in the grooves R on the thin metal film 31 by electrolytic plating as shown in FIG. 4(e). Copper, for example, can be used as the conductive layer 33. The thickness of the conductive layer 33 is preferably not less than 5 μm and not more than 35 μm, and is 8 μm in the present embodiment.

Then, the plating resist 32 is removed by stripping as shown in FIG. 4(f). Note that the plating resist 32 may be removed by chemical etching (wet etching).

An exposed region of the thin metal film 31 is subsequently removed by etching as shown in FIG. 4(g). In this way, the wiring patterns 12 (see FIG. 1 and FIG. 2) constituted by the thin metal films 31 and the conductive layer 33 are formed.

Next, an electroless tin plating layer 34 is formed so as to cover the wiring patterns 12 as shown in FIG. 5(h). Then, the cover insulating layer CIL is formed on the base insulating layer BIL so as to cover the wiring patterns 12 and the electroless tin plating layer 34 in a predetermined region of the mounting part 11 (see FIG. 1 and FIG. 2) as shown in FIG. 5(i). The thickness of the cover insulating layer CIL is preferably not less than 6 μm and not more than 50 μm, and is 20 μm in the present embodiment. Accordingly, the printed circuit board 1 shown in FIG. 1 and FIG. 2 is completed.

(4) Details of the Wiring Patterns 12 and the Test Terminals T

Details of the wiring patterns 12 and the test terminals T will now be described with reference to drawings.

Figure 6:
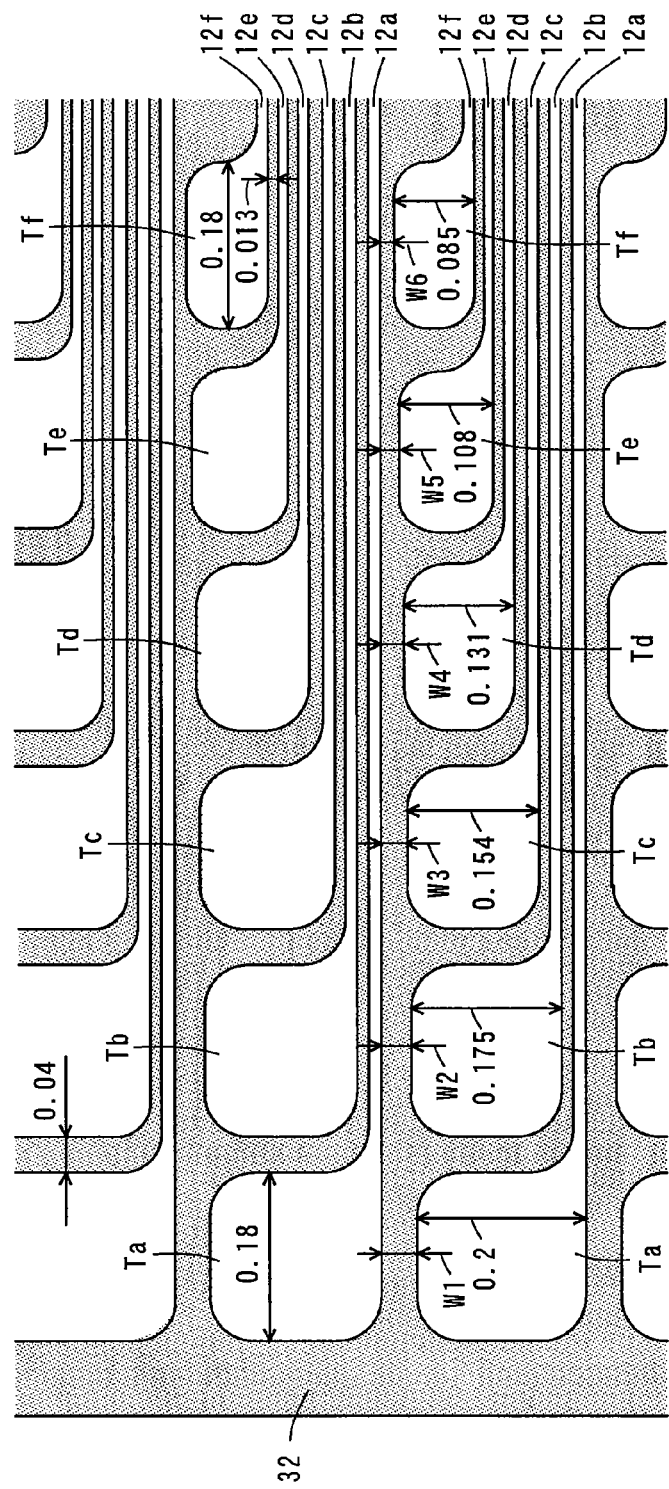
FIG. 6 is a plan view showing details of a plurality of wiring patterns and a plurality of test terminals.

FIG. 6 is a plan view showing details of the wiring patterns 12 and the test terminals T. FIG. 6 shows a plan view of the process of FIG. 4(e). In FIG. 6, the plating resist 32 is represented by a dot pattern.

In addition, the plurality of wiring patterns 12 are denoted with characters 12a to 12f, and the plurality of test terminals T are denoted with characters Ta to Tf in order to identify each of the plurality of wiring patterns 12 and each of the plurality of test terminals T in FIG. 6. Note that one group is constituted by respective predetermined numbers of (six each in the present embodiment) wiring patterns 12a to 12f and test terminals Ta to Tf.

The plurality of wiring patterns 12a to 12f are formed so as to extend in parallel with each other. Each of the plurality of test terminals Ta to Tf is formed in a substantially rectangular shape such that a width thereof increases toward one side from each end of the plurality of wiring patterns 12a to 12f. The plurality of test terminals Ta to Tf in each group are arranged so as to be aligned along a length direction of the wiring patterns 12a to 12f.

Hereinafter, the length direction of the wiring patterns 12a to 12f is simply abbreviated as the length direction, and a direction vertical to the length direction (a width direction) of the wiring patterns 12a to 12f is simply abbreviated as the width direction.

The wiring patterns 12a to 12f are formed so as to be longer in this order, and the test terminals Ta to Tf are further away from the mounting region 21 of FIG. 2 in this order. That is, the wiring pattern 12a is the longest, and the test terminal Ta is farthest away from the mounting region 21. The wiring pattern 12f is the shortest, and the test terminal Tf is closest to the mounting region 21.

In the process of FIG. 4(e), the plating resist 32 is formed in an interspatial region between the wiring patterns 12a to 12f and the test terminals Ta to Tf.

Respective sides of the test terminals Ta to Tf in each group are formed in parallel with the wiring pattern 12a in a group adjacent thereto. Intervals W1 to W6 (the width of the plating resist 32) between the test terminals Ta to Tf in each group and the wiring pattern 12a in the other group adjacent thereto are set to decrease in this order as shown in the following expression.

$$W1 > W2 > W3 > W4 > W5 > W6$$

That is, the interval (the width of the plating resist 32) W1 between the test terminal Ta that is farthest away in each group from the mounting region 21 and the wiring pattern 12a, being the closest to the group, in the other group adjacent thereto is the largest, and the interval (the width of the plating resist 32) W6 between the test terminal Tf that is the closest in each group to the mounting region 21 and the wiring pattern 12a, being the closest to the group, in the other group adjacent thereto is the smallest.

In the present embodiment, the interval W1 is set to be 0.023 mm, the interval W2 to be 0.021 mm, the interval W3 to be 0.019 mm, the interval W4 to be 0.017 mm, the interval W5 to be 0.015 mm and the interval W6 to be 0.013 mm, for example. That is, the interval W6 to W1 are set to increase by 0.002 mm in this order.

Intervals between the wiring patterns 12a to 12f (the width of the plating resist 32) of each group in the width direction are equal, and are 0.013 mm, for example. Moreover, intervals between the test terminals Ta to Tf (the width of the plating resist 32) of each group in the length direction are equal, and are 0.04 mm, for example.

The lengths of the test terminals Ta to Tf in the length direction are substantially equal, and are set to be 0.18 mm, for example.

In addition, the widths of the test terminals Ta, Tb, Tc, Td, Te, Tf in the width direction are set to be, for example, 0.2 mm, 0.175 mm, 0.154 mm, 0.131 mm, 0.108 mm and 0.085 mm, respectively.

While each of the test terminals Ta to Tf is formed to be substantially rectangular with four corners thereof rounded in the example shown in FIG. 6, the test terminals Ta to Tf may be formed to be rectangular with the four corners thereof not rounded.

(5) Effects of the Present Embodiment

In the present embodiment, the interval between the test terminal Ta that is farthest away in each group from the mounting region 21 and the wiring pattern 12a, the closest to the group, in the other group adjacent thereto is larger than the interval between the test terminal Tf that is the closest in each group to the mounting region 21 and the wiring pattern 12a, being the closest to the group, in the other group adjacent thereto. This can sufficiently increase, in the manufacture, the width of the plating resist 32 that is formed between the region where the test terminal Ta at the end of the longest wiring pattern 12a is formed and the region where the wiring pattern 12a in the other group adjacent thereto is formed while maintaining the small intervals between the plurality of wiring patterns 12a to 12f arranged in parallel with each other. Thus, generation of defects in the wiring patterns 12a to 12f due to collapse of the plating resist 32 can be prevented.

Moreover, the width of the plating resist 32 formed between the region where the test terminals Ta to Tf are formed and the region where the wiring pattern 12a, being the closest to the group of the test terminals Ta to Tf, in the other group adjacent thereto is formed can be increased as the wiring patterns 12a to 12f where the test terminals Ta to Tf are formed become longer. That is, the width of a portion, being likely to collapse, of the plating resist 32 can be increased. Accordingly, the generation of the defects in the wiring patterns 12a to 12f due to the collapse of the plating resist 32 can be sufficiently prevented.

As a result, the fine pitch wiring patterns 12a to 12f can be formed without the generation of the defects in the wiring patterns 12a to 12f.

(6) Other Embodiments

A material for the long-sized substrate 30 is not limited to stainless-steel. For example, other metal materials such as copper and nickel can be used.

A material for the base insulating layer BIL is not limited to polyimide. For example, other resin materials such as polyester, polyethylene terephthalate, polyether nitrile and polyethersulphone may be used.

A material for the wiring patterns 12 is not limited to copper. For example, other metal materials such as copper alloy, gold and aluminum may be used.

A material for the cover insulating layer CIL is not limited to polyimide. For example, other resin materials such as polyester, polyethylene terephthalate film, polyether nitrile film and polyethersulphone film may be used.

The wiring patterns 12 may be formed by using a two-layer base material such as a copper laminated plate.

(7) Correspondences between Elements in the Claims and Parts in Embodiments

In the following paragraph, non-limiting examples of correspondences between various elements recited in the claims below and those described above with respect to various embodiments of the present invention are explained.

In the above-described embodiment, the base insulating layer BIL is an example of an insulating layer, the wiring patterns 12, 12a to 12f are examples of a wiring pattern, the plating resist 32 is an example of a resist pattern, the test terminals T, Ta to Tf are examples of a test terminal portion, and the conductive layer 33 is an example of a conductive layer.

As each of various elements recited in the claims, various other elements having configurations or functions described in the claims can be also used.

INVENTIVE EXAMPLES (a) Inventive Example

In an inventive example, the printed circuit board 1 having the wiring patterns 12a to 12f and the test terminals Ta to Tf shown in FIG. 6 was manufactured by the semi-additive method based on the above-described embodiment.

In the inventive example, the plating resist 32 did not collapse in the process of the electrolytic plating.

(b) Comparative Example

Figure 7:
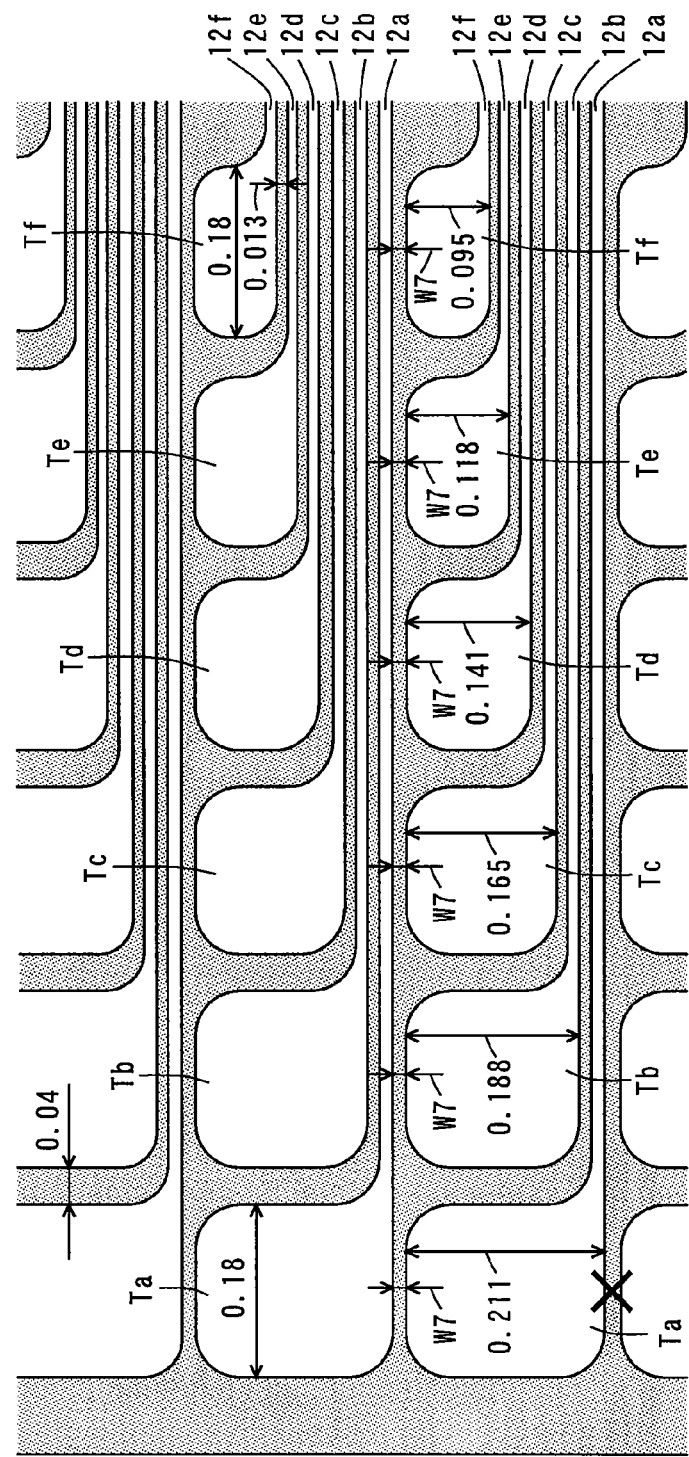
FIG. 7 is a plan view showing details of a plurality of wiring patterns and a plurality of test terminals in a printed circuit board of a comparative example.

In a comparative example, the printed circuit board 1 having the wiring patterns 12a to 12f and the test terminals Ta to Tf shown in FIG. 7 was formed by the semi-additive method. FIG. 7 is a plan view showing details of the wiring patterns 12a to 12f and the test terminals Ta to Tf in the printed circuit board of the comparative example.

For the wiring patterns 12a to 12f and the test terminals Ta to Tf in the comparative example, different points from the test terminals Ta to Tf and the wiring patterns 12a to 12f in the inventive example will be described below.

As shown in FIG. 7, intervals (the width of the plating resist 32) W7 between the test terminals Ta to Tf in each group and the wiring pattern 12a in the other group adjacent thereto were equally set to be 0.012 mm in the comparative example.

Similarly to the inventive example, the intervals (the width of the plating resist 32) between the wiring patterns 12a to 12f of each group in the width direction were equally set to be 0.013 mm. Moreover, similarly to the inventive example, the intervals (the width of the plating resist 32) between the test terminals Ta to Tf of each group in the length direction were equally set to be 0.04 mm.

Similarly to the inventive example, the lengths of the test terminals Ta to Tf in the length direction were equally set to be 0.18 mm.

The widths of the test terminals Ta, Tb, Tc, Td, Te, Tf in the width direction were set to be 0.211 mm, 0.188 mm, 0.165 mm, 0.141 mm, 0.118 mm and 0.095 mm, respectively.

In the comparative example, the plating resist 32 between the test terminal Ta that is farthest away in each group from the mounting region 21 and the wiring pattern 12a, being the closest to the group, in the other group adjacent thereto collapsed in the process of the electrolytic plating, as indicated by X in FIG. 7. As a result, the defects occurred in the wiring pattern 12a.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A printed circuit board including a mounting region where an electronic component is to be mounted and a non-mounting region where an electronic component is not mounted, comprising:

an insulating layer including said mounting region and said non-mounting region; and a plurality of wiring patterns that are formed from an inside of said mounting region on said insulating layer to an inside of said non-mounting region on said insulating layer, wherein respective ends of said plurality of wiring patterns in said non-mounting region increase widths thereof toward respective one sides to form a plurality of test terminal portions, respectively, respective portions of said plurality of wiring patterns on said plurality of test terminal portions side are arranged in parallel with each other, said plurality of wiring patterns are divided into a plurality of groups each including a predetermined number of, at least two, wiring patterns, said predetermined number of test terminal portions in each group are arranged along a length direction of the wiring patterns, and an interval between the test terminal portion that is farthest away in each group from said mounting region and the wiring pattern, being the closest to the group, in the other group adjacent thereto is larger than an interval between the test terminal portion that is the closest in each group to said mounting region and the wiring pattern, being the closest to the group, in said other group adjacent thereto.

2. The printed circuit board according to claim 1, wherein an interval between said predetermined number of test terminal portions in each group and the wiring pattern, being the closest to the group, in said other group adjacent thereto become larger with increasing distance from said mounting region.

3. A manufacturing method of a printed circuit board including a mounting region where an electronic component is to be mounted and a non-mounting region where the electronic component is not mounted, comprising the steps of:

forming a resist pattern on an insulating layer including said mounting region and said non-mounting region excluding a region where a plurality of wiring patterns extending from an inside of said mounting region to an inside of said non-mounting region are to be formed;

forming a conductive layer on said insulating layer excluding a region where said resist pattern is formed; and forming said plurality of wiring patterns on said insulating layer by removing said resist pattern, wherein respective ends of said plurality of wiring patterns in said non-mounting region increase widths thereof toward respective one sides to form a plurality of test terminal portions, respectively, respective portions of said plurality of wiring patterns on said plurality of test terminal portions side are arranged in parallel with each other, said plurality of wiring patterns are divided into a plurality of groups each including a predetermined number of, at least two, wiring patterns, said predetermined number of test terminal portions in each group are arranged along a length direction of the wiring patterns, and said resist pattern is formed, in the process of forming said resist pattern, such that an interval between the test terminal portion that is farthest away in each group from said mounting region and the wiring pattern, being the closest to the group, in the other group adjacent thereto is larger than an interval between the test terminal portion that is the closest in each group to said mounting region and the wiring pattern, being the closest to the group, in said other group adjacent thereto.

4. The manufacturing method of the printed circuit board according to claim 3, wherein said resist pattern is formed, in the process of forming said resist pattern, such that an interval between said predetermined number of test terminal portions in each group and the wiring pattern, being the closest to the group, in said other group adjacent thereto become larger with increasing distance from said mounting region.

* * * * *